(12) United States Patent
Granneman et al.

(10) Patent No.: US 6,877,250 B2
(45) Date of Patent: Apr. 12, 2005

(54) APPARATUS, METHOD AND SYSTEM FOR THE TREATMENT OF A WAFER

(75) Inventors: Ernst Hendrik August Granneman, Hilversum (NL); Vladimir Ivanovich Kuznetsov, Delft (NL); Gert Jan Snijders, Amersfoort (NL)

(73) Assignee: ASM International N.V., Bilthoven (NL)

( * ) Notice: Subject to any disclaimer, the term of this patent is extended or adjusted under 35 U.S.C. 154(b) by 190 days.

(21) Appl. No.: 10/316,218

(22) Filed: Dec. 10, 2002

(65) Prior Publication Data

US 2003/0101612 A1 Jun. 5, 2003

Related U.S. Application Data

(63) Continuation of application No. 09/752,655, filed on Dec. 28, 2000, now Pat. No. 6,560,896.

(30) Foreign Application Priority Data

Dec. 29, 1999 (NL) .............................................. 1013989

(51) Int. Cl.⁷ .............................. F26B 7/00; B65B 49/07
(52) U.S. Cl. .............................. 34/391; 34/428; 34/380; 34/359; 34/367; 34/393; 34/443; 34/460; 34/497; 414/935; 414/941
(58) Field of Search .......................... 34/359, 360, 367, 34/370, 381, 393, 443, 460, 62, 363, 364, 372, 391, 395, 417, 428, 433, 461, 493, 497, 65, 138, 139, 211, 380; 414/935, 941

(56) References Cited

U.S. PATENT DOCUMENTS

| 4,148,575 A | 4/1979 | Siryj | |
| 4,622,918 A | 11/1986 | Bok | |
| 4,860,687 A * | 8/1989 | Frijlink | 118/500 |
| 4,987,856 A | 1/1991 | Hey et al. | |
| 4,990,047 A | 2/1991 | Wagner et al. | |
| 5,094,013 A | 3/1992 | Martin et al. | |
| 5,241,758 A | 9/1993 | Cruz et al. | |
| 5,281,320 A | 1/1994 | Turner et al. | |
| 5,411,076 A * | 5/1995 | Matsunaga et al. | 165/80.2 |
| 5,431,700 A * | 7/1995 | Sloan | 29/25.01 |
| 5,855,465 A | 1/1999 | Boitnott et al. | |
| 5,863,170 A | 1/1999 | Boitnott et al. | |
| 5,911,461 A | 6/1999 | Sauter et al. | |
| 5,974,682 A | 11/1999 | Akimoto | |
| 6,068,089 A * | 5/2000 | Brooks et al. | 187/414 |
| 6,097,005 A | 8/2000 | Akimoto | 219/444 |
| 6,111,225 A | 8/2000 | Ohkase et al. | 219/390 |
| 6,183,565 B1 | 2/2001 | Granneman et al. | |
| 6,209,220 B1 | 4/2001 | Raaijmakers | |
| 6,215,106 B1 | 4/2001 | Boas et al. | 218/390 |
| 6,285,102 B1 | 9/2001 | Matsuoka et al. | |

FOREIGN PATENT DOCUMENTS

| DE | 3608783 | 9/1987 | |
| EP | 0 829 904 | 3/1998 | |
| NL | 1012004 | * 11/2000 | ........... H01L/21/00 |
| WO | WO 90/13687 | 11/1990 | |
| WO | WO 98/01890 | 1/1998 | |
| WO | WO 98/36444 | 8/1998 | |
| WO | WO 99/03138 | 1/1999 | |

* cited by examiner

Primary Examiner—K. B. Rinehart
(74) Attorney, Agent, or Firm—Knobbe, Martens, Olson & Bear, LLP

(57) ABSTRACT

In an apparatus for a treatment of a wafer at elevated temperatures, the wafer is taken out of the reactor after heat treatment with the help of a mechanical transport apparatus which preferably grips the wafer around the circumference and on the under side. The transport apparatus includes a wafer surrounding ring. The wafer is placed in a floating wafer reactor where it is cooled in a controlled manner. Transport for further action or treatment then takes place.

9 Claims, 2 Drawing Sheets

APPARATUS, METHOD AND SYSTEM FOR THE TREATMENT OF A WAFER

This is a continuation of application Ser. No. 09/752,655, filed on Dec. 28, 2000 now U.S. Pat. No. 6,560,896. This application is also related to U.S. Application Ser. No. 10/186,269, entitled METHOD AND APPARATUS FOR THE TREATMENT OF SUBSTRATES, filed Jun. 27, 2002.

BACKGROUND OF THE INVENTION

Field of the Invention

The present invention relates to cooling of wafers.

The treatment of semiconductor wafers generally takes place at a raised temperature. This temperature can have a different value for different treatment steps. There are treatment steps which are carried out at a temperature which does not differ significantly from the ambient temperature and there are also treatment steps which are carried out at a temperature from a couple of hundred degrees Celsius to 1200 degrees Celsius. In the treatment chamber in question, the wafer is brought up to the temperature needed for that process step. After the treatment step has finished, the wafer should be cooled down again before it can be transported within the treatment apparatus to the next station to undergo the next treatment step. The placing of a hot wafer in certain atmospheres can bring about undesirable and unintentional effects, which make the wafer unusable. To avoid these effects, the wafer should be cooled after a treatment step at a high temperature before the wafer is transported to the next treatment station. Moreover, after the last treatment step in the treatment system, the wafer should be cooled down before it can be placed in the plastic transport cassette.

This cooling down can take place in the treatment station itself by switching off the heating means. It can be a disadvantage to have the treatment station experience a range of temperatures during the treatment of a wafer, due to the loosening of deposited layers from the walls of the treatment station and the such like. In addition, depending on the design of the treatment station, it can cost a great deal of energy to continually expose the whole treatment station to a range of temperatures. Moreover, many treatment stations are better equipped to quickly heat the wafer than to quickly cool the wafer. The lower the temperature, the smaller the heat exchange through radiation and conductance. The quick cooling requires some special measures which are not always easy to integrate into the treatment stations themselves. For this reason, separate cooling stations are used in the prior art.

In EP 827.187A, a cooling station is described in working relationship with a multi-chamber treatment system wherein the treatment chambers and the wafer transport chambers are kept under vacuum conditions. Under vacuum conditions, heat transport by conduction via the present gas is practically non-existent. The heat contact between the wafer and the cooled plateau on which the wafer is placed is thus bad unless further measures are taken. In the European patent application mentioned, it is proposed to clamp the wafer electrostatically onto the cooled plateau which gives the possibility of introducing gas on the rear side of the wafer whereby the heat exchange between the wafer and plateau is significantly improved without the wafer being blown away and without the vacuum in the cooling station being significantly disturbed. A disadvantage of this method is that the heat removal takes place substantially to the side of the plateau while the opposite side is not made use of. Moreover, this one-sided cooling leads to significant thermal tensions with possible harmful consequences for the wafer. In addition the plateau with the electrostatic clamping provision comprises various synthetic parts which cannot withstand temperatures higher than a couple of hundred degrees Celsius.

During the thermal treatment of wafers at a high temperature, apart from the intended treatment at the desired temperature, an unintentional treatment also takes place during the heating up of the wafer to the treatment temperature and the cooling down of the wafer from the treatment temperature to the ambient temperature. Although during the design of an integrated circuit this unintentional thermal treatment is taken into account, there are still circumstances wherein the effect of these treatments are harmful. An example is the activating of doping electrons after implantation in the wafer; a high temperature step is needed to bring about the electrical activation of the implanted atoms. However, this high temperature step also has the consequence that, by diffusion, a spreading of the depth-concentration profile of the implanted atoms takes place. It appears that the most effective activation in combination with the most minimal spreading of the concentration profile occurs with as short as possible a heat treatment at high temperature. A treatment of 1 second at 1050.degree. C. gives the same degree of activation but less spread than the treatment of 10 seconds at 1000.degree. C., see M. A. Foad, G. de Cock, D. Jennings, T-S Wang and T. Cullis, Uniform Spike Anneals of Ultra Energy Boron Implants Using xR LEAP and RTP Xe.sub.plus Centura: Ramp Rate Effects Up to 150.degree. C./sec (XIIth Ion Implantation Technology Conference, Kyoto 1998). For this, the realization of high heating up and cooling down speeds is of notable importance. In the prior art a Rapid Thermal Processing reactor is used for this purpose. This is a reactor where, in an otherwise cold surrounding, the wafer is heated by lamps. By putting a high lamp power into operation, a high heating up speed is possible, up to approximately 150.degree. C./s. Cooling down is achieved by switching off the lamps and the wafer loses its heat again, substantially by radiation. From FIG. 1 of the above-mentioned publication, it appears that the cooling speed of approx. 50.degree. C./s is considerably smaller than the heating up speed. This is partly caused by the fact that, for a uniform heating up, mirrors are placed around the reactor chamber which reflect back part of the radiation energy given off by the wafer. With a free radiation in the area, without mirrors being present, a higher cooling down speed is achieved, but even then the cooling down speed remains limited to approximately 100.degree. C./s at a temperature of 1000.degree. C. while at lower temperatures the heat exchange by radiation decreases proportionally with the temperature to the fourth power.

In WO98/01890 a reactor is described for the treatment of wafers at a raised temperature. To do this a wafer is taken into an area bounded by two housing-parts whereby from each of the housing-parts a gas flow is supplied to the wafer. In this way, both the housing-parts and the gas have a raised temperature and heating of the wafer can take place in a particularly quick manner.

From the European application 829904 it is known to cool wafers in a separate station. To that end the wafer is spaced from two members with lifting pins. Cooling is realized by a flow of gas moving along the wafer, the gas being only provided for heat transport by conductance. From the PCT application WO98/01890 heating of the wafer in floating condition is known. In U.S. Pat. No. 5,974,682A a partially open ring for transporting of wafers is described.

SUMMARY OF CERTAIN INVENTIVE ASPECTS

It is the aim of the present invention to provide a cooling station wherein the wafer is cooled down on both sides by approximately equal amounts, evenly and quickly over the whole surface.

It is the aim of the present invention to provide a method for a thermal treatment wherein, after the treatment at high temperature, the wafer is placed in a cooling station and is cooled evenly on both sides and the occurrence of thermal tensions are avoided. It is also the aim of the invention to provide a method for thermal treatment wherein directly after the end of the high temperature step the wafer is transferred to the cooling station as quickly as possible. It is also the aim of the present invention to provide a method for the thermal treatment wherein after the treatment at high temperature, the wafer is placed in a cooling station that can withstand a wafer with a very high temperature being placed on it (1200.degree. C.). A further aim of the invention is to provide a method for a thermal treatment wherein after the treatment at high temperature the wafer is placed in a cooling station and wherein the wafer is cooled down as quickly as possible. A further aim of the invention is to provide a method for the thermal treatment of wafers wherein the treatment time at high temperature is short and the production capacity of the thermal treatment chamber is used as optimally as possible.

According to a first aspect of the invention, this aim is realized in that in the position moved towards each other the spacing between the walls of the housing-parts, delimiting the volume wherein the wafer is introduced, is such that the spacing between the wafer provided therein and the surfaces of the housing-parts directed thereto is less than 1 mm, wherein both housing-parts are provided with gas supply channels, opening near the walls in the cooling compartment such that a gas bearing for supporting of a wafer provided in the compartment is realized, wherein said housing-parts are provided with cooling means for cooling said gas bearing.

According to a further aspect of the invention, an apparatus is provided for cooling a wafer, comprising a first and second housing-part which are arranged so that they can move away and from and towards each other and define in the position moved towards each other a cooling compartment, wherein in the condition moved towards each other the spacing between the walls of the housing-parts defining the volume wherein the wafer is introduced, is such that the spacing between the wafer introduced therein and the surfaces of both house-parts is less than 1 mm, wherein one of said housing-parts is provided with gas supply channels, opening near a wall thereof in the cooling compartment, wherein at least one of said housing-parts is provided with cooling means, wherein wafer transport means are provided, being movable between the position outside said apparatus and a position between the housing-parts being moved away from each other and wherein said housing-parts are provided with an accommodation for receiving at least part of said wafer transporting means.

According to another further aspect of the invention a method is provided for the treatment of a wafer comprising the heating of said wafer to a raised temperature during the execution of a treatment in a first station, the transporting of that wafer to a second station and there cooling said wafer, wherein the cooling of said wafer in that second station comprises the taking in of that wafer between two cooling blocks positioned at a first large distance from each other, then moving said two cooling blocks towards each other until a second smaller distance is reached in between which a cooling area is bounded, in which said wafer is taken in at a distance from both cooling blocks, the letting through of a cooling gas along at least one side of the wafer such that a gas bearing for supporting is formed therein, followed by the moving away from each other of the cooling blocks and the removal of the wafer for its further treatment.

According to another further aspect of the invention a system is provided for treating of a wafer, comprising a first station realized as a heating apparatus, wafer transport means and a second station realized as a cooling apparatus, wherein said second station comprises an apparatus having a first and second housing-parts which are ranged so that they can move away from and towards each other and define in the position moved towards each other a cooling compartment, wherein in the condition moved towards each other the spacing between the walls of the housing-parts, defining the volume wherein the wafer is provided, is such that the spacing between the wafer provided therein and the surfaces of the housing-parts directed to the wafer is less than 1 mm, wherein both housing-parts are provided with gas supply channels, which open near the walls in said cooling compartment such that a gas bearing for supporting the wafer arranged in said compartment is provided, wherein said housing-parts are provided with cooling means for cooling said gas bearing.

According to the present invention an apparatus and method for the thermal treatment of wafers is proposed wherein after the thermal treatment the wafer is taken up in a contact-free manner in a cooling station directly bounding the thermal treatment chamber. With the help of a wafer handling robot, the wafer is placed between two wafer encompassing, substantially level and on the side surfaces of the wafer parallel cooling bodies which after placing of the wafer are moved towards each other until the surface of the cooling bodies are at a very small distance from the surface of the wafer. The wafer can be mechanically supported, for example by at least three pins on which the wafer rests. It is also possible that the wafer remains mechanically supported by the transport means during the cooling. At relatively low temperatures it its even possible that the wafer rests on the lower cooling body. This very small distance is kept up for some time, after which the cooling bodies are again moved away from each other and the wafer can be taken out from between the cooling bodies by the wafer handling robot.

In a preferred embodiment of the invention, the wafer is held in place contact-free in the moved-towards-each-other position of the housing-parts, by oppositely directed gas flows from these cooling bodies. This variant is particularly advantageous when the treatment temperature in the thermal treatment chamber is high, for example, higher than 500.degree. C.

Since the wafer is taken in contact-free and is cooled on both sides substantially equally, no limits have to be placed on the maximum temperature of the wafer which is placed in the cooling station. Since no mechanical contact takes place with the wafer and no electrostatic clamping is used, there is a high degree of freedom in the choice of material of the cooling bodies and materials can be chosen which can withstand a sufficiently high temperature. In addition, by a suitable choice of the specific heat capacity and the heat conduction coefficient of the material of the cooling bodies and a suitable dimensioning of the cooling bodies and by the contact-free introduction of the wafer, the surface temperature of the cooling bodies anyway remains within certain limits. A further advantage of the invention is that, as the wafer is cooled by substantially equal amounts on both sides and over the entire surface, no deformation or tensions occur during cooling whereby the wafer could become damaged. A further advantage is that, due to the small distance between the wafer and cooling bodies, 1 mm or less, preferably approximately 0.1 mm, the heat transport by conduction through the narrow, gas-filled gap between wafer and cooling body increases very sharply. Heat transport by conduction is after all proportional to the temperature difference and inversely proportional to the distance to be covered. In this way, a very high cooling speed is achieved for a large temperature range. When the wafer temperature approaches the temperature of the cooling body, the heat transport will decrease since the heat transport by conduction is proportional to the temperature difference. However, in the case of heat transport by radiation, the heat transport is proportional to the temperature to the power four and the heat transport decreases much faster at decreasing temperature than in the case of heat transport by conduction.

The cooling bodies are provided with cooling means to remove the heat given off by the wafers to the cooling bodies. These means can consist of channels, a cooling medium such as cooling-water that flows through these channels and a drain for this cooling system. The cooling bodies can also be provided with temperature sensors and a control to be able to accurately regulate the temperature of the cooling bodies. The temperature of the cold reactor part can be 20.degree. C. but it can also have a somewhat lower or higher value, up to a maximum of 100.degree. C. In an alternative embodiment, the cold reactor part can also be provided with Peltier cooling elements which bring the temperature of the cold reactor part significantly below room temperature, for example –20.degree. C.

To be able to remove the wafer at high temperature from the thermal treatment apparatus and to transport it to the cooling station without the wafer being damaged by large thermal tensions due to extra heat loss at the edge of the wafer, it is proposed that use be made of a wafer surrounded ring wherein the wafer is brought in and out of the thermal treatment apparatus resting on the bearing points of that ring, as described in WO 00/68977, which is incorporated by reference. Various embodiments of this ring are possible. In a preferred embodiment of the invention, the wafer is also surrounded by a ring during thermal treatment. The wafer can rest on the bearing points of the ring during treatment, but preferably by a small vertical displacement of the wafer or of the ring, the wafer no longer rests on the bearing points of the ring during thermal treatment. As the wafer remains surrounded by the ring during the treatment, no time is lost after the wafer is introduced with removing the ring before the treatment commences and no time is lost after the treatment has finished with the introduction of the ring before the wafer can be removed.

The thermal treatment chamber can comprise every thermal treatment chamber known in the prior of the art. For example, a thermal treatment chamber in which the wafer is taken in contact-free, between two side pieces, and the wafer is held in place by oppositely directed gas flows from these side pieces, as described in WO 98/01890 (allowed U.S. application Ser. No. 09/227,564) of applicant, which is incorporated by reference. The thermal treatment chamber can also be a Rapid Thermal Processing chamber in which the wafer is heated to the desired temperature by lamps.

To achieve a high production capacity of the thermal treatment chamber, various system configurations are proposed. Due to the particular requirements that are placed on the transport of the wafer and the related use of the mentioned ring, it is proposed that, in addition to the thermal treatment chamber and the cooling station, use is also made of a separate input/output station. Using a wafer handling robot usual in the industry, a wafer from a standard wafer cassette can be introduced into the input/output station or can be removed from the input/output station and placed in the wafer cassette. In the input/output station the wafer is fitted in the ring and, once placed in the ring, is transported to and placed in the thermal treatment chamber. After its stay in the thermal treatment chamber, the wafer is transported to the cooling station where the wafer is cooled to such a low temperature that can then be placed back in the wafer cassette without any problems. After its stay in the cooling station, the wafer is finally transported back to the input/output station where the wafer is taken out of the ring and the wafer handing robot brings the wafer to the wafer cassette.

In an advantageous embodiment, the various stations are placed in a pressure chamber which can be closed off from the surroundings, into which a controlled gas atmosphere such as nitrogen gas can be introduced to prevent undesired effects during transport, particularly during transport from the thermal treatment chamber to the cooling station, when the wafer is still hot. The gas pressure in this chamber can deviate from the atmospheric pressure and can be higher or lower. In a further advantageous embodiment, three stations are placed at the corners of an equilateral triangle and the wafer is transported from the one station to the next with the help of a spoked wheel with at least three spokes rigidly connected to each other wherein the mutual angle between the spokes is 120 degrees, for example. At the end of each spoke is a ring, such as mentioned earlier, in which the wafer is fitted. When the system is fully operational, actions can take place at all three stations simultaneously. While in the thermal treatment chamber a wafer is subjected to the thermal step, a wafer is cooled in the cooling station and in the input/output station a treated and cooled wafer is removed and a new wafer to be treated is introduced. When the actions at all stations are completed, the three wafers are simultaneously transported to the following station by rotating the spoked wheel by 120 degrees. It will be clear that this is an extremely efficient manner of transporting wafers; at the same time as a wafer is removed from a station, the following wafer is introduced. In a common wafer transport technique in the prior art, a number of operations will take place serially: a) the wafer is removed form the station Y by the wafer handing robot, b) the wafer is introduced into the following station Z by the wafer handling robot, c) the wafer handling robot if now available to take a new wafer out of the next station X, d) finally the new wafer is introduced to station Y. All of these four actions are carried out simultaneously by the spoked wheel. Similar spoked wheels or turntables are known as such in the prior art (U.S. Pat. Nos. 4,987,856, U.S. Pat. No. 4,990,047, 5,863,170, 5,855,465). Depending on the diameter of the wafer and the length of the side of the equilateral triangle, it is possible that the wafer is not entirely removed from a station while the introduction in the following station has already commenced. The combination of spoked wheel with mentioned ring which is present during the treatment produces an extremely short takeover time from the thermal treatment chamber to the cooling station. In this way, the occurrence of temperature gradients across the whole wafer during the transport of the wafer are kept to a minimum.

Problems with this system appear when the time defined for the thermal treatment is so short that there is not enough time during the thermal treatment to remove a wafer from the input/output station and to place a new wafer. The treatment time is an important quantity which cannot be adapted according to wish to the circumstances of the moment. Immediately after the treatment time expires, the spoked wheel must be available to carry out a transferal of the wafer to the following station. This means that, in these circumstances, the other two spokes cannot be made use of and there can only be one wafer at a time in the system. This affects the productivity of the system. For this reason, according to the invention a system is proposed for such short treatment times, wherein instead of a spoked wheel with at least three spokes rigidly connected to each other, two spokes are present which move independently from each other. When the thermal treatment is completed, one spoke can take the wafer to the cooling station while in the input/output station the removal of the treated wafers and the introduction of a new wafer is completed. Then, this new wafer is brought to the thermal treatment chamber with the help of the second spoke.

Other configurations are possible. It is thus possible to combine the functions of cooling and input/output stations. Then, with a short treatment time a configuration could be used wherein-two such combined stations in combination with a thermal treatment chamber and two independent from each other moveable spokes are used. An input/output station with two wafer positions situated one above the other can also be used or more than three stations can be used. It is naturally also possible, instead of a spoked wheel, to use a wafer handling robot with r and theta movement possibilities.

The invention also relates to a system with the above described features.

BRIEF DESCRIPTION OF THE DRAWINGS

The invention will be elucidated further with reference to example embodiments. Therein.

DETAILED DESCRIPTION OF THE PREFERRED EMBODIMENT

Figure 1:
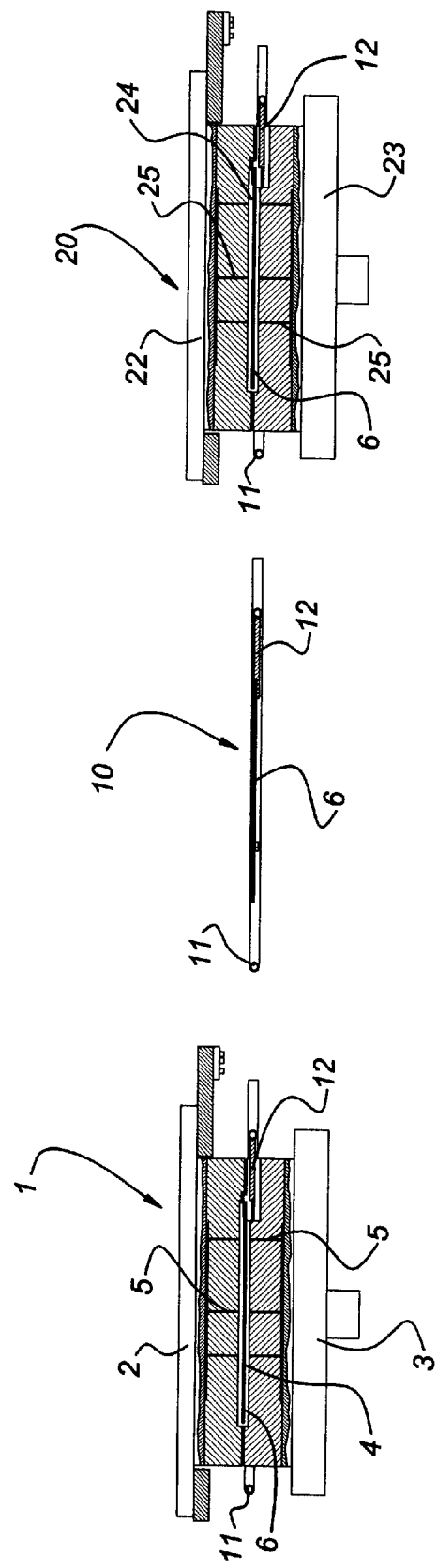
FIG. 1 shows the various steps of the method according to the invention, schematically.

In FIG. 1, 1 shows a heating apparatus for the individual heating of wafers. This consists of two plate pieces 2 and 3 which can be moved towards each other. In the moved-towards-each-other position as schematically shown in FIG. 1, treatment chamber 4 or compartment is bounded by the two plate pieces. In both plates, gas outlet openings, schematically shown by 5, are present from which gas flows in operation and whereby the wafer indicated by 6 is kept in a floating position between two side pieces 2 and 3. Both the plate pieces 2 and 3 and the gas coming from the opening 5 are at a high temperature whereby the wafer is heated in an even way up to the desired temperature at which the treatment takes place.

When the two pieces 2 and 3 move away from each other, access to the wafer is possible with the help of wafer transport means indicated by 10. These consist of a ring 11 provided with supporting lips 12. This ring is connected in a not further depicted manner to a control (or arm provided with power/or wafer handling robot) to move the ring together with the wafer between the heating apparatus 1 and the cooling apparatus 20 to be described hereafter. The ring 11 has such a heat capacity that the extra cooling which would occur at the edges of the wafer is substantially negated whereby the temperature distribution of the wafer during transport remains substantially even, whereby warping and other damage to the wafer are avoided. The heating device is provided with heating means (not shown) bringing the wafer to the desired temperature by heat conductance of the out flowing gas.

With the help of transport means 10, the wafer is moved to the cooling apparatus 20. This consists, just as the heating installation 1, of plate pieces 22 and 23 positioned opposite each other. After the placing of the wafer 6, the plate pieces 22 and 23 can be moved towards each other to bound a treatment chamber 24. On both sides of the wafer, gas with a proportionally low temperature is supplied by way of openings 25. The temperature of the gas is approximately equal to the temperature of the plate pieces 22 and 23 and in this way wafer 6 can cool down quickly. With the help of the invention, cooling of the wafer 6 after treatment in chamber 4 is achieved in a fast and controlled manner. In order to obtain the lower temperature the plate pieces 22 and 23 are provided with cooling means (not shown) such as water ducts.

Figure 2:
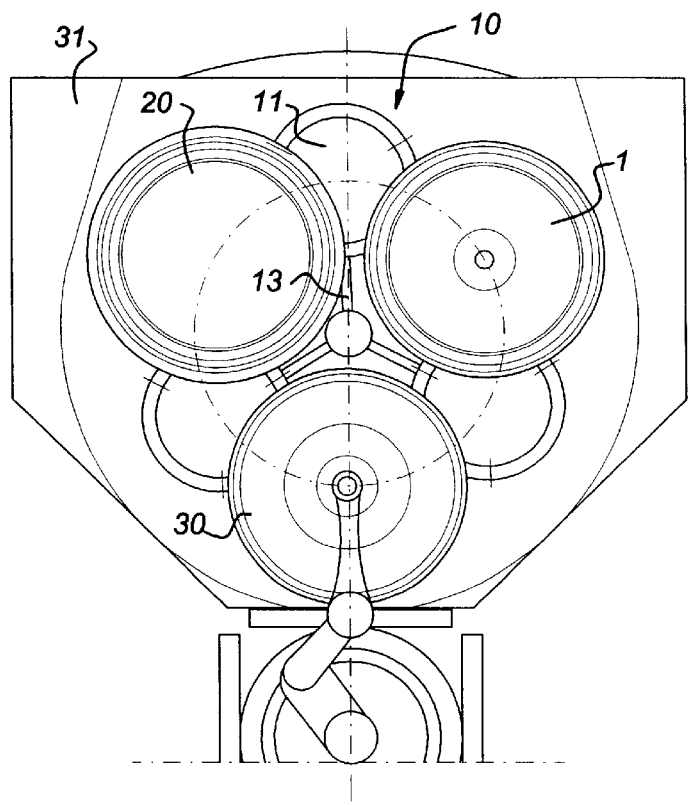
FIG. 2 shows top-down schematic view of set-up of the various treatment apparatuses shown in FIG. 1 and FIGS. 3a–d show various methods by which such a system can be used.

In FIG. 2 a top-down view of the set-up of the heating apparatus 1, the cooling apparatus 20 and the input/output station 30 is shown. The transport means are indicated by 10 and now arm 13 is shown on which ring 11 is fitted. These stations are taken into a closed area which is schematically indicated by 31.

After the wafer is brought into station 30 with the help of the transport means 10, the wafer is brought into heating apparatus 1, which is the open position. After its closing and the following treatment of the wafer at raised temperature, this is opened again and, with the help of the transport means 10, the wafer is brought into the cooling station 20. After closing, a treatment also takes place there and, with the help of such a reactor, wherein the wafer is kept floating, a particularly quick but still even cooling can be realized. The wafer is then transported to station 30 to be removed for further treatment.

To further make use of the capacity, FIG. 3 schematically shows a number of possibilities for the transport means 10. The stations are provided with the same reference numbers.

Figure 3A:
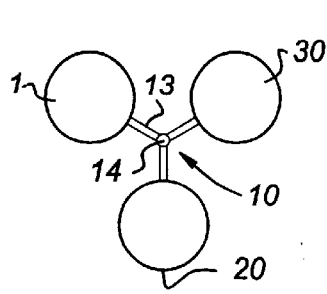

In FIG. 3a the transport means 10 consist of three arms 13 which are permanently fixed to each other and which rotate around a common point 14. This is a rigid coupling. That is, two wafers can be simultaneously treated in the reactor and the cooling station wherein the staying time in apparatus 1 and 20 is by definition the same.

Figure 3B:
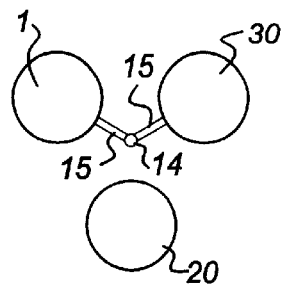

In FIG. 3b a variant is shown wherein the arms indicated by 15 still turn around a mutual central axis 14 but are moveable independently from each other. In this way, the individual treatment times in the various stations can be taken into account. Here, one of the positions is always unoccupied.

Figure 3C:
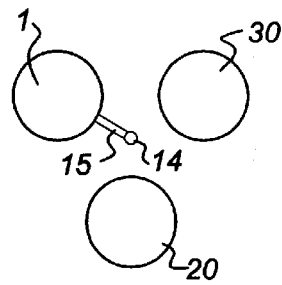
Figure 3D:
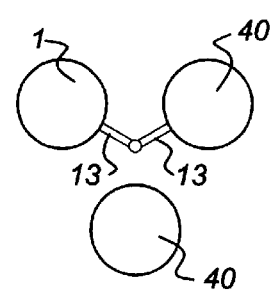

In the embodiment according to FIG. 3c only a single arm is provided. With this embodiment the highest flexibility results, because the residence time in the several stations can be chosen fully independent from each other.

In FIG. 3c the cooling station is combined with the input/output position and there are two such combination stations present, indicated by 40. As the cooling station has a very small volume, the purging time to bring about an inert gas atmosphere of sufficient purity after loading a wafer is particularly short in such a combination station. The arms 13 in this variant can move independently of each other. It will be understood that the set-up above is very much dependent on the desired through speed, that is, the capacity of the set-up and the differences in staying time between the various stations. For those skilled in the state of the art it is easy to design further variants after reading the above, which variants lie within the scope of the attached claims.

What is claimed is:

1. An apparatus for rapidly cooling a wafer, comprising a first and second housing-part, which are arranged so that they can move away from and towards each other, and delimiting in the position moved towards each other a cooling compartment, wherein in the position moved towards each other the spacing between walls of the housing-parts, delimiting the volume wherein the wafer is introduced, is such that the spacing between the wafer provided therein and the surfaces of the housing-parts directed thereto is less than 1 mm, wherein both housing parts are provided with gas supply channels, opening near the walls in the cooling compartment such that a gas bearing for supporting of a wafer provided in the compartment is realized, wherein said housing-parts are provided with cooling means for cooling said gas bearing; and a wafer transport device movable between a position outside said apparatus and a position between said housing-parts being moved from each other, and wherein said housing-parts are provided with an accommodation for receiving at least a part of said wafer transport device so that at least said part of said wafer transport device and said wafer are between said housing-parts during cooling of said wafer enabling the apparatus to rapidly cool the wafer.

2. The apparatus of claim 1, wherein both housing-parts are provided with means for keeping the related housing-part at a substantially constant temperature, wherein the constant temperature is lower than about 100 degrees Celsius.

3. The apparatus of claim 1, wherein the wafer transport device comprises gripping means for a circumference edge of said wafer.

4. The apparatus of claim 3, wherein the wafer transport device leaves the wafer surface at both sides thereof substantially clear.

5. The apparatus of claim 1, wherein said wafer transport device comprises a ring surrounding said wafer.

6. An apparatus for rapidly cooling a wafer, comprising a first and second housing-part which are arranged so that they can move away and from and towards each other and define in the position moved towards each other a cooling compartment, wherein in the condition moved towards each other the spacing between the walls of the housing-parts defining the volume wherein the wafer is introduced, is such that the spacing between the wafer introduced therein and the surfaces of both housing-parts is less than 1 mm, wherein one of said housing-parts is provided with gas supply channels, opening near a wall thereof in the cooling compartment, wherein at least one of said housing-parts is provided with cooling means, wherein wafer transport means are provided, being movable between the position outside said apparatus and a position between the housing-parts being moved away from each other and wherein said housing-parts are provided with an accommodation for receiving at least a part of said wafer transporting means so that at least said part of said wafer transport device and said wafer are between said housing-parts during cooling of said wafer enabling the apparatus to rapidly cool the wafer.

7. The apparatus of claim 6, wherein said wafer transporting means are provided with gripping means for gripping a circumferential edge of said wafer.

8. The apparatus of claim 7, wherein said transporting means leave the wafer surface at both sides substantially clear.

9. The apparatus of claim 6, wherein the wafer transporting means comprise a ring surrounding said wafer.

* * * * *